US008779751B2

(12) United States Patent
Hori et al.

(10) Patent No.: US 8,779,751 B2
(45) Date of Patent: Jul. 15, 2014

(54) SWITCHING APPARATUS AND TEST APPARATUS

(75) Inventors: Hisao Hori, Miyagi (JP); Yoshikazu Abe, Miyagi (JP); Yoshihiro Sato, Miyagi (JP)

(73) Assignee: Advantest Corporation, Tokyo (JP)

( * ) Notice: Subject to any disclaimer, the term of this patent is extended or adjusted under 35 U.S.C. 154(b) by 269 days.

(21) Appl. No.: 13/275,339

(22) Filed: Oct. 18, 2011

(65) Prior Publication Data

US 2012/0268102 A1 Oct. 25, 2012

(30) Foreign Application Priority Data

Dec. 3, 2010 (JP) ................................ 2010-269964

(51) Int. Cl.
*G01R 19/00* (2006.01)

(52) U.S. Cl.
USPC .......... 324/76.11; 324/72; 324/727; 324/415; 324/418; 324/422; 73/649; 310/311; 200/61.41

(58) Field of Classification Search
USPC ................ 324/76.11, 72, 727, 415, 418, 422; 73/649; 310/311; 200/61.41
See application file for complete search history.

(56) References Cited

U.S. PATENT DOCUMENTS

| | | | | |
|---|---|---|---|---|
| 7,098,577 | B2 * | 8/2006 | Mehta | 310/332 |
| 8,007,494 | B1 * | 8/2011 | Taylor et al. | 606/34 |
| 2004/0037708 | A1 * | 2/2004 | Murasato et al. | 417/99 |
| 2007/0188049 | A1 * | 8/2007 | Song et al. | 310/322 |
| 2008/0142348 | A1 * | 6/2008 | Nguyen et al. | 200/275 |
| 2009/0115821 | A1 * | 5/2009 | Tsukamoto | 347/68 |
| 2011/0181150 | A1 * | 7/2011 | Mahameed et al. | 310/328 |

FOREIGN PATENT DOCUMENTS

| | | | |
|---|---|---|---|
| JP | S54-78994 | A | 6/1979 |
| JP | S60-48259 | U | 4/1985 |
| JP | S62-200779 | A | 9/1987 |
| JP | H03-128681 | A | 5/1991 |
| JP | H05-133997 | A | 5/1993 |
| JP | H07-229953 | A | 8/1995 |
| JP | 2001-191300 | A | 7/2001 |
| JP | 2009-170677 | A | 7/2009 |
| JP | 2009170677 | A * | 7/2009 |
| WO | 2007-083769 | A | 7/2007 |

OTHER PUBLICATIONS

Japanese Office Action for application No. 2010-269964, issued on Jul. 19, 2011.

* cited by examiner

*Primary Examiner* — Jermele M Hollington
*Assistant Examiner* — Sean Curtis

(57) ABSTRACT

To restrict a bowing amount of a piezoelectric actuator, provided is a switching apparatus comprising a contact point section including a first contact point; and an actuator that moves a second contact point to contact or move away from the first contact point. The actuator includes a first piezoelectric film that expands and contracts according to a drive voltage to change a bowing amount of the actuator, and a second piezoelectric film that is provided in parallel with the first piezoelectric film and restricts bowing of the actuator when the drive voltage is not being supplied to the first piezoelectric film.

19 Claims, 4 Drawing Sheets

100

SWITCHING APPARATUS AND TEST APPARATUS

BACKGROUND

1. Technical Field

The present invention relates to a switching apparatus and a test apparatus.

2. Related Art

A conventional actuator is known that is formed by using a semiconductor process to layer piezoelectric films and electrodes that apply voltage to the piezoelectric films, as shown in Patent Document 1, for example.

Patent Document 1: Japanese Patent Application Publication No. 2001-191300

However, such an actuator is formed by layering different materials, and therefore bowing of the piezoelectric films occurs due to stress, for example, even in an initial state when voltage is not applied. Furthermore, when the temperature of the piezoelectric films changes due to the ambient temperature of the actuator, the amount of bowing of the actuator also changes according to the temperature change, and so it is difficult for the actuator to operate properly.

SUMMARY

Therefore, it is an object of an aspect of the innovations herein to provide a switching apparatus and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a switching apparatus comprising a contact point section including a first contact point; and an actuator that moves a second contact point to contact or move away from the first contact point. The actuator includes a first piezoelectric film that expands and contracts according to a drive voltage to change a bowing amount of the actuator, and a second piezoelectric film that is provided in parallel with the first piezoelectric film and restricts bowing of the actuator when the drive voltage is not being supplied to the first piezoelectric film.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
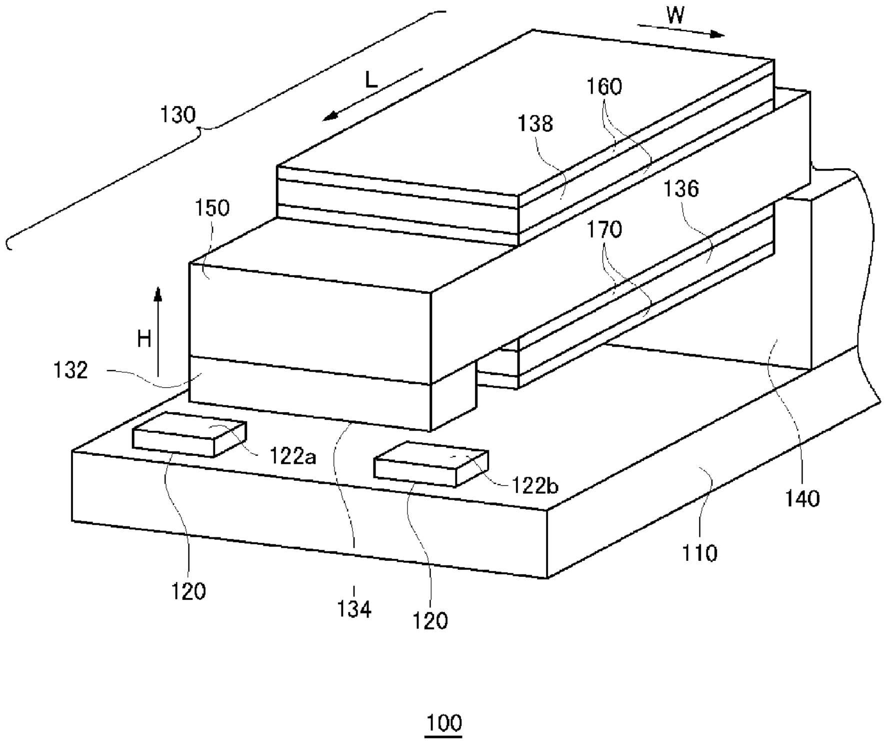
FIG. 1 shows an exemplary configuration of a switching apparatus 100 according to an embodiment of the present invention.
Figure 2:
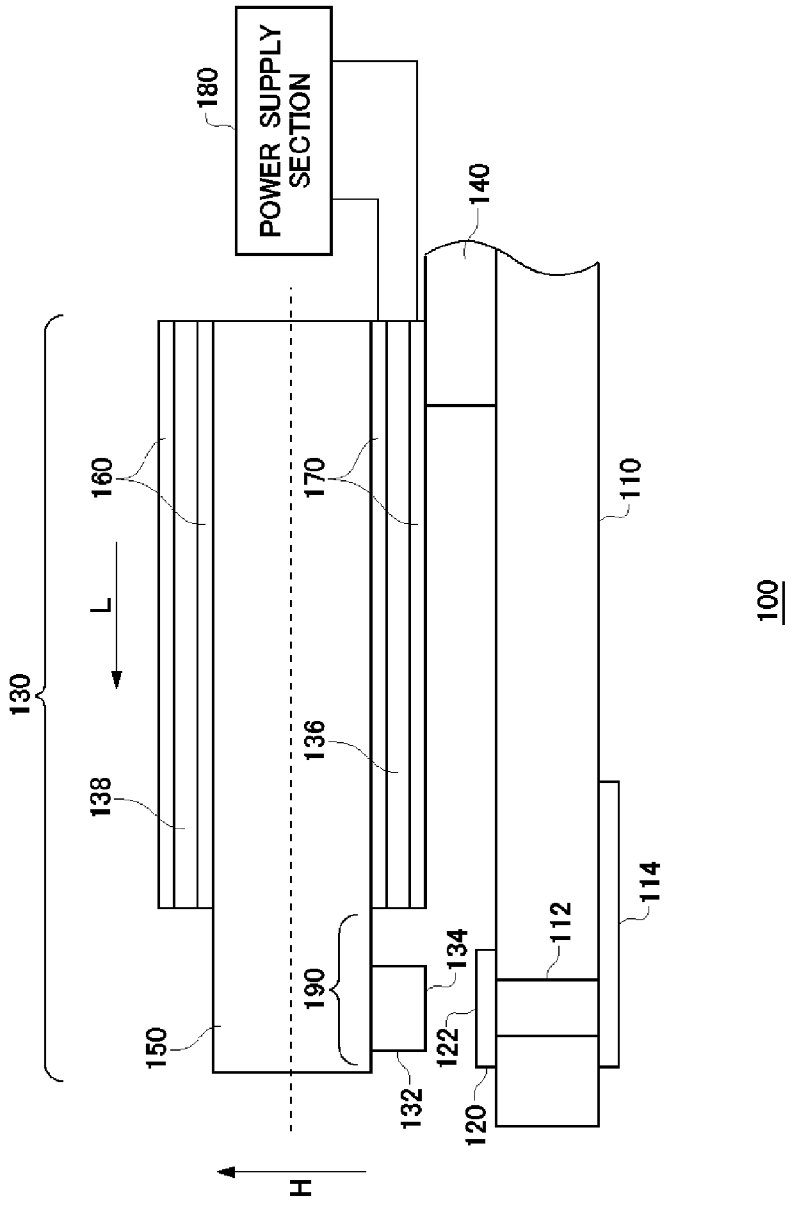
FIG. 2 shows a side view of the switching apparatus 100 according to the present embodiment.

FIG. 1 shows an exemplary configuration of a switching apparatus 100 according to an embodiment of the present invention. FIG. 2 shows a side view of the switching apparatus 100 according to the present embodiment. The switching apparatus 100 causes a first contact point 122 and a second contact point 134 to contact each other and move away from each other, and restricts bowing of the actuator 130 when voltage is not being applied to the piezoelectric films. The switching apparatus 100 may be housed and sealed in a package, for example. The switching apparatus 100 includes a substrate 110, a first contact point section 120, an actuator 130, a base portion 140, and a power supply section 180.

The substrate 110 includes a flat first surface on which the first contact point section 120 is disposed. The substrate 110 may be an insulator. The substrate 110 may be an insulating glass substrate, or may be a semiconductor substrate made of silicon, for example. The substrate 110 includes a via 112 and a wiring section 114. The substrate 110 may include the wiring section 114 on a second surface thereof, which is different from the first surface on which the first contact point section 120 is provided. If the switching apparatus 100 is housed in a package, the substrate 110 may be a portion of the package.

The via 112 is formed of metal and electrically connects the first contact point section 120 to the wiring section 114. The via 112 may be formed to maintain a sealed state by being filled with a conductive material. The substrate 110 may include a plurality of vias 112 corresponding to the number of first contact point sections 120 disposed on the substrate 110.

The wiring section 114 transmits a signal passed through the switching apparatus 100. The wiring section 114 may be a wiring pattern provided on the second surface of the substrate 110 to receive or transmit a signal to or from at least one via 112. The wiring section 114 may include a land, a connector, or an antenna, and may transmit and receive signals passed through the switching apparatus 100 from the outside.

The first contact point section 120 includes a first contact point 122. The first contact point 122 may be a flat surface without any protrusions. The first contact point section 120 may include aluminum, tungsten, palladium, rhodium, gold, platinum, ruthenium, indium, iridium, osmium, molybdenum, and/or nickel. The first contact point 122 may be an alloy of two or more of the above materials.

In the present embodiment, the switching apparatus 100 includes two first contact point sections 120 on the substrate 110, and two first contact points 122 of the first contact point sections 120 are brought into contact with and moved away from one second contact point 134. For example, signal transmission from one of the first contact points **122*a* to the other first contact point 122*b*, via the second contact point 134, can be turned ON/OFF. In this case, the wiring section 114 transmits a signal from the outside to the first contact point 122*a*, and this signal is transmitted from the first contact point 122*b* to the outside when the switching apparatus 100** is ON.

Instead, the switching apparatus 100 may include one first contact point section 120 on the substrate 110, a wiring section that transmits a signal from the outside to the second contact point 134 via the actuator 130 may be provided on the actuator 130, and the one first contact point 122 may be brought into contact with and moved away from the second contact point 134. In this way, the switching apparatus 100 can switch the signal transmission from the second contact point 134 to the first contact point 122 ON/OFF. The wiring section 114 transmits a signal received from the outside to the outside from the first contact point 122 when the switching apparatus 100 is ON.

The actuator 130 moves the second contact point 134 to contact or move away from the first contact point 122. The actuator 130 is deposited using a semiconductor process. The actuator 130 includes a second contact point section 132, a first piezoelectric film 136, a second piezoelectric film 138, a first support layer 150, electrode layers 170 of the first piezoelectric film 136, electrode layers 160 of the second piezoelectric film 138, and an exposed portion 190.

The second contact point 134 is provided on the second contact point section 132. The second contact point section 132 may include the same metal as the first contact point section 120. The second contact point 134 may be a flat surface without any protrusions, so as to contact the surface of the first contact point 122. Instead, the second contact point 134 may be semispherical in order to prevent degradation or damage of the first contact point 122, or may have a tip shaped as a rounded needle. For example, the second contact point 134 may have a predetermined shape that, when the second contact point 134 contacts the first contact point 122 to form a transmission path, creates a signal path having a width corresponding to the frequency of the signal being transmitted.

The first piezoelectric film 136 expands and contracts according to the drive voltage, in order to change the bowing amount of the actuator 130. The first piezoelectric film 136 is arranged to expand and contract in the longitudinal direction of the actuator 130 when the drive voltage is applied thereto, such that the actuator 130 curves to change the distance between the first contact point 122 and the second contact point 134.

Perovskite ferroelectric substances such as barium titanate (BTO), lead lanthanum zirconate titanate (PLZT), Lead zirconate titanate (PZT), aluminum nitride (AlN), or a zinc oxide (ZnO) wurtzite crystal may be used as the first piezoelectric film 136. For example, the first piezoelectric film 136 may be made of PZT and have a width in the W direction of 90 μm, a length in the L direction of 750 μm, and a height in the H direction of 1 μm.

The second piezoelectric film 138 is provided in parallel with the first piezoelectric film 136, and restricts the bowing of the actuator 130 when the drive voltage is not applied to the first piezoelectric film 136. The second piezoelectric film 138 may be formed using perovskite ferroelectric substances, in the same manner as the first piezoelectric film 136. The second piezoelectric film 138 preferably uses substantially the same material and has substantially the same shape as the first piezoelectric film 136. For example, the second piezoelectric film 138 may be made of PZT and have a width in the W direction of 90 μm, a length in the L direction of 750 μm, and a height in the H direction of 1 μm.

When PZT is used, the PZT may be deposited after depositing zirconate titanate (PT). In this way, the PZT can be deposited with good crystallinity.

The first piezoelectric film 136 and the second piezoelectric film 138 are formed on respective sides of a central plane of the actuator 130 in the thickness direction. As a result, the second piezoelectric film 138 restricts bowing of the actuator 130 caused by the stress of the first piezoelectric film 136. The first piezoelectric film 136 causing the actuator 130 to bend is layered on a film made of a different material in the present embodiment, and therefore the piezoelectric film 136 is deformed after being formed due to the residual stress, thereby causing bowing of the actuator 130.

The second piezoelectric film 138 is formed of substantially the same material as the first piezoelectric film 136 and has substantially the same shape as the first piezoelectric film 136, and is formed on a surface of the actuator 130 that is opposite the side on which the first piezoelectric film 136. Therefore, the second piezoelectric film 138 exerts a force that causes bowing in a direction that is opposite the bowing caused by the first piezoelectric film 136, thereby suppressing the bowing of the actuator 130.

The second piezoelectric film 138 restricts bowing of the actuator 130 caused by the expansion and contraction due to temperature change of the first piezoelectric film 136. The first piezoelectric film 136 is layered on a film made of a material having a different thermal expansion coefficient, and is therefore deformed by thermal stress caused by temperature change, thereby causing bowing of the actuator 130. The second piezoelectric film 138 is made of substantially the same material as the first piezoelectric film 136, has substantially the same shape as the first piezoelectric film 136, and is formed on a surface of the actuator 130 that is opposite the side on which the first piezoelectric film 136 is formed. Therefore, the second piezoelectric film 138 exerts a force that causes bowing in a direction that is opposite the bowing caused by the temperature change, thereby suppressing the bowing of the actuator 130 caused by temperature change.

The first support layer 150 is provided between the first piezoelectric film 136 and the second piezoelectric film 138. The first support layer 150 is elastic and deforms when force is applied thereto, so that the actuator 130 bends when the first piezoelectric film 136 expands or contracts to exert a force on the first support layer 150. The first support layer 150 is rigid enough to prevent the actuator 130 from being bent too much, and to return the actuator 130 to the initial position when the first piezoelectric film 136 is not applying a force.

A conductor such as aluminum, gold, or platinum, an insulator such as glass, or a semiconductor such as silicon may be used for the first support layer 150.

When forming the first piezoelectric film 136 and/or the second piezoelectric film 138, the first support layer 150 is heated to a firing temperature along with the first piezoelectric film 136 and/or the second piezoelectric film 138. Therefore, the first support layer 150 is made from a material that is not damaged when heated to the firing temperature of the first piezoelectric film 136 and/or the second piezoelectric film 138. In other words, the first support layer 150 is preferably made of a material that does not exhibit physical damage such as cracks or fissures when heated to the firing temperature of the first piezoelectric film 136 and/or the second piezoelectric film 138. Specifically, if the first piezoelectric film 136 and the second piezoelectric film 138 are made of PZT, for example, the firing temperature can exceed 700° C.

Furthermore, the first support layer 150 is preferably made of a material that is unlikely to cause a chemical reaction with the piezoelectric films or the electrode layers when heated to the firing temperature of the first piezoelectric film 136 and the second piezoelectric film 138. The first support layer 150 is preferably made of a material that forms a compound with the piezoelectric films or the electrode layers as a result of being heated to the firing temperature of the piezoelectric films, and that does not exhibit physical damage such as cracks or fissures. In this case, the first support layer 150 is preferably made of a material that does not degrade the film characteristics, such as the piezoelectric constant, of the first piezoelectric film 136 or the second piezoelectric film 138 when heated to the firing temperature of the piezoelectric films.

The first support layer 150 may be an insulating layer. By forming the first support layer 150 as an insulating layer, the first support layer 150 can tolerate the firing temperature of the piezoelectric films at approximately 700° C. and can be formed using a method such as CVD that is less expensive than a metal film.

The first support layer 150 may include silicon oxide ($SiO_2$) or silicon nitride (SiN). The first support layer 150 may be silicon oxide ($SiO_2$), for example. Instead, the first support layer 150 may be silicon nitride (SiN), for example. The first support layer 150 may be made of silicon oxide ($SiO_2$) and have a width in the W direction of 90 μm, a length in the L direction of 750 μm, and a height in the H direction of 3 μm.

The electrode layers 160 are formed on the top and bottom surfaces of the first piezoelectric film 136 and the electrode layers 170 are formed on the top and bottom surfaces of the second piezoelectric film 138, and each apply a drive voltage. The electrode layers 160 and the electrode layers 170 are each flat and extend in the length direction L of the actuator 130. The electrode layers 160 and the electrode layers 170 may be made from metals that can be easily processed with low resistance, such as aluminum, gold, platinum, copper, indium, tungsten, molybdenum, ruthenium, and iridium, oxide compound electrodes such as ruthenium oxide ($RuO_2$) and iridium oxide ($IrO_2$), ceramic electrodes, or semiconductors such as silicon.

If silicon is used as the electrode material, the silicon is preferably doped to have high impurity density. For example, the electrode layers 160 and the electrode layers 170 may each be made of platinum and have a height of 0.2 μm in the height direction H. If the platinum is deposited using a vacuum deposition technique such as sputtering, the platinum may be deposited after depositing titanium or tantalum, for example.

The electrode layers 160 and the electrode layers 170 may include electrode layers formed of platinum or oxide film. If the first support layer 150 is made of silicon oxide, for example, the electrodes made of platinum or oxide film in this way can prevent the silicon oxide component from reacting with the first piezoelectric film 136 and/or the second piezoelectric film 138 as a result of the thermal processing during the manufacturing of the electrodes.

The exposed portion 190 is a portion of the first support layer 150 at one end thereof, which is the moving end of the actuator 130, where the first piezoelectric film 136 and the second piezoelectric film 138 are not formed. The second contact point 134 may be formed on the exposed portion 190. Instead, the second contact point 134 may be formed on the first piezoelectric film 136. In this case, the first support layer 150 may be covered by the first piezoelectric film 136 and the electrode layers 170 up to the tip thereof.

The portion of the electrode layer 170 facing the substrate 110 and positioned at the tip of the actuator 130 may operate as the second contact point 134. In this case, in order to prevent loss during high-frequency signal transmission, the second contact point 134 is provided on the surface of the first piezoelectric film 136 and is electrically isolated from the rest of the electrode layer 170.

The base portion 140 is arranged on the substrate 110 at a position near the first contact point section 120 but distanced therefrom. The base portion 140 may be formed of $SiO_2$, for example. Instead, the base portion 140 may be a portion of the substrate 110 formed of silicon or glass, for example. The height of the base portion 140 is equal to or less than the maximum displacement of the actuator 130. The maximum displacement of the actuator 130 refers to the displacement of the actuator 130 when the maximum drive voltage is applied to the first piezoelectric film 136.

The actuator 130 may be fixed on the substrate 110 via the base portion 140, for example. The actuator 130 is supported at one end of the base portion 140 in the length direction L. When the drive voltage is applied to the first piezoelectric film 136, the end of the actuator 130 on the second contact point side that is not supported by the base portion 140 bends in the height direction, which results in downward displacement or upward displacement in FIG. 2.

The actuator 130 may be supported by the base portion 140, and the base portion 140 may be fixed above the actuator 130. For example, the actuator 130 may be housed in a package that seals the actuator 130, and the base portion 140 may be fixed to a lid of the package above the actuator 130.

The power supply section 180 applies the drive voltage to the first piezoelectric film 136. The power supply section 180 applies a first drive voltage to the first piezoelectric film 136 when brining the first contact point 122 and the second contact point 134 into contact with each other to turn ON the switching apparatus 100. The power supply section 180 may stop the supply of the drive voltage to the first piezoelectric film 136 when moving the first contact point 122 and the second contact point 134 away from each other to turn OFF the switching apparatus 100. Instead, the power supply section 180 may apply a predetermined drive voltage that is different from the first drive voltage to the first piezoelectric film 136 when turning OFF the switching apparatus 100.

The switching apparatus 100 of the present embodiment described above turns transmission of an input signal ON and OFF. The first piezoelectric film 136 and the second piezoelectric film 138 may have substantially the same thickness and be at substantially the same distance from the central place of the actuator 130 in the thickness direction. As a result, the stress exerted by the first piezoelectric film 136 causing the bowing is substantially the same as the stress exerted by the second piezoelectric film 138 restricting the bowing.

The actuator 130 may include a plurality of films layered substantially symmetrically with respect to the central plane in the thickness direction. The dashed line in FIG. 2 indicates the central plane of the actuator 130 in the thickness direction. As a result, the residual stress, thermal stress, or the like that is generated by layering the plurality of films and exerts a force causing the actuator 130 to bow is substantially the same as the residual stress, thermal stress, or the like that that is generated by layering the plurality of films exerts a force in a direction opposite the bowing, thereby restricting bowing of the actuator 130. Furthermore, since bowing of the actuator 130 due to thermal stress can be restricted, the actuator 130 can perform switching in a variety of temperature environments.

For example, the actuator 130 of the present embodiment may be formed by layering, in the height direction H, an electrode layer 170 (platinum, 0.2 μm), a first piezoelectric film 136 (PZT, 1 μm), an electrode layer 170 (platinum, 0.2 μm), a first support layer 150 ($SiO_2$, 3 μm), an electrode layer 160 (platinum, 0.2 μm), a second piezoelectric film 138 (PZT, 1 μm), and an electrode layer 160 (platinum, 0.2 μm). In this case, the actuator 130 is formed substantially symmetrically with respect to the central plane in the height direction.

Figure 3:
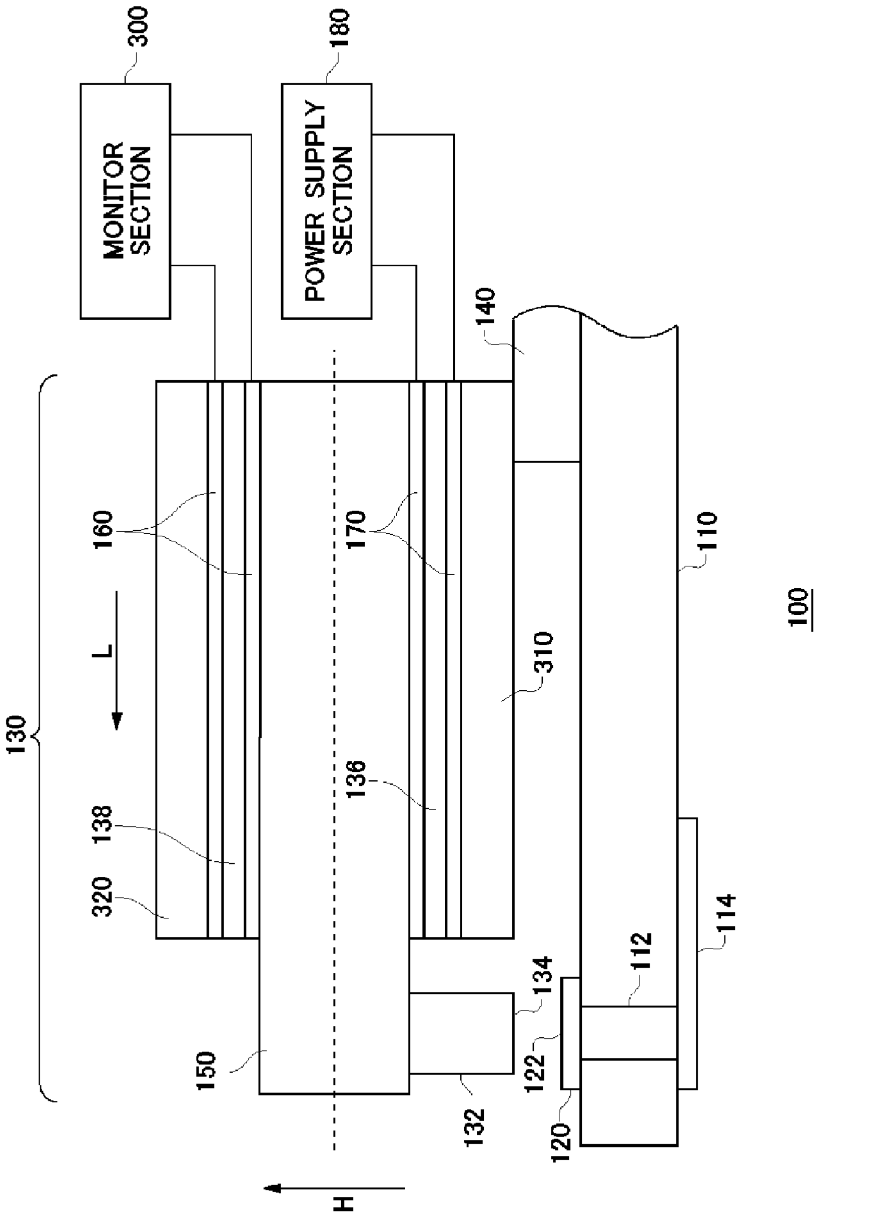
FIG. 3 shows a modification of the switching apparatus 100 according to the present embodiment.

FIG. 3 shows a modification of the switching apparatus 100 according to the present embodiment. Components of the switching apparatus 100 of the present modification that are the same as those of the switching apparatus 100 according to the present embodiment described in FIGS. 1 and 2 are given the same reference numerals, and descriptions thereof are omitted.

The actuator 130 of the present modification further includes a second support layer 310 and a third support layer 320 provided respectively outward from the first piezoelectric film 136 and the second piezoelectric film 138 with respect to the central plane of the actuator 130 in the height direction H. The second support layer 310 and the third support layer 320 have substantially the same shape, are made of substantially the same material, have substantially the same thickness, and are arranged at substantially the same distance from the central plane in the thickness direction.

As a result, the actuator 130 can cause the residual stress, thermal stress, or the like causing the bowing and the residual stress, thermal stress, or the like restricting the bowing, which are generated by the layering of the two support layers, to be substantially equal, thereby restricting the bowing of the actuator 130.

The second support layer 310 and the third support layer 320 may include silicon oxide ($SiO_2$) or silicon nitride (SiN). The second support layer 310 and the third support layer 320 may be silicon oxide ($SiO_2$), for example. Instead, the second support layer 310 and the third support layer 320 may be silicon nitride (SiN), for example. As a result, the second support layer 310 and the third support layer 320 can increase the rigidity of the actuator 130 and, while restricting the bowing, protect the electrode layer 160 and the electrode layer 170 from being exposed to the outside atmosphere.

The actuator 130 of the present modification may further include a monitor section 300 that detects the bowing amount of the actuator 130. The monitor section 300 is connected to the electrode layer 160 and detects a displacement voltage generated by the second piezoelectric film 138 due to the displacement of the first support layer 150. As a result, the electrode layer 160 can be used as an electrode of the monitor section 300 for detecting the bowing amount, while restricting bowing of the actuator 130 by being formed of the same material as the electrode layer 170, having the same shape as the electrode layer 170, and being arranged substantially symmetrically to the electrode layer 170 with respect to the central plane of the actuator 130 in the thickness direction.

The monitor section 300 may detect the bowing amount of the actuator 130 for the drive voltage supplied to the actuator 130 by the power supply section 180, in order to monitor whether the ON/OFF switching function of the switching apparatus 100 is operating correctly. Instead, the monitor section 300 may be connected to the electrode layer 170 and detect the displacement voltage generated by the first piezoelectric film 136 due to displacement of the first support layer 150.

The actuator 130 of the present embodiment may be formed by layering, in the height direction H, $SiO_2$ (0.5 μm), titanium (no more than 0.1 μm), an electrode layer 170 (platinum, 0.2 μm), PT (no more than 0.1 μm), a first piezoelectric film 136 (PZT, 1 μm), an electrode layer 170 (platinum, 0.2 μm), titanium (no more than 0.1 μm), a first support layer 150 ($SiO_2$, 3 μm), titanium (no more than 0.1 μm), an electrode layer 160 (platinum, 0.2 μm), PT (no more than 0.1 μm), a second piezoelectric film 138 (PZT, 1 μm), an electrode layer 160 (platinum, 0.2 μm), titanium (no more than 0.1 μm), and $SiO_2$ (0.5 μm). In this case, the actuator 130 is formed with a total thickness of approximately 6 μm, and at least 90% of the actuator 130 is formed substantially symmetrically.

The switching apparatus 100 of the present embodiment described above is an example in which driving is achieved by applying a drive voltage to the first piezoelectric film 136. Instead, the switching apparatus 100 may achieve driving by applying a drive voltage to the second piezoelectric film 138. Furthermore, the switching apparatus 100 may achieve driving by applying drive voltages to both the first piezoelectric film 136 and the second piezoelectric film 138.

The switching apparatus 100 of the present embodiment described above is an example in which the actuator includes two layers of piezoelectric films, which are the first piezoelectric film 136 and the second piezoelectric film 138. Instead, the actuator 130 may include a plurality of sets of two or more piezoelectric films that are each formed substantially symmetrically with respect to the central plane in the thickness direction.

Figure 4:
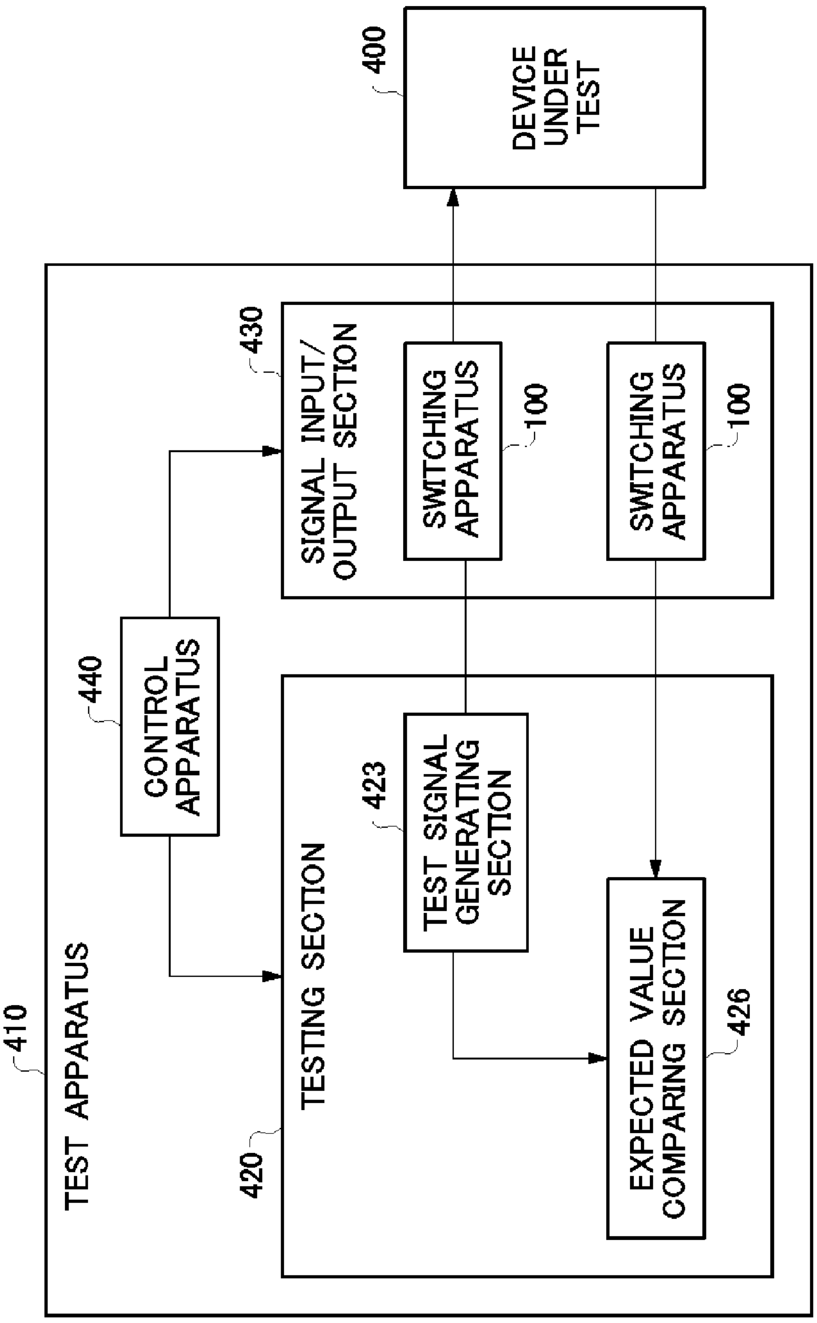
FIG. 4 shows an exemplary configuration of a test apparatus 410 according to the present embodiment, along with a device under test 400.

FIG. 4 shows an exemplary configuration of a test apparatus 410 according to the present embodiment, along with a device under test 400. The test apparatus 410 tests at least one device under test 400, which may be an analog circuit, a digital circuit, an analog/digital mixed circuit, a memory, or a system on chip (SOC), for example. The test apparatus 410 supplies the device under test 400 with a test signal based on a test pattern for testing the device under test 400, and judges pass/fail of the device under test 400 based on an output signal output by the device under test 400 in response to the test signal.

The test apparatus 410 includes a testing section 420, a signal input/output section 430, and a control section 440. The testing section 420 tests the device under test 400 by exchanging electric signals with the device under test 400. The testing section 420 includes a test signal generating section 423 and an expected value comparing section 426.

The test signal generating section 423 generates a plurality of test signals to be supplied to the device under test 400. The test signal generating section 423 may generate expected values for the response signals output by the device under test 400 in response to the test signals. The test signal generating section 423 may be connected to a plurality of devices under test 400 via the signal input/output section 430 to test the plurality of devices under test 400.

The expected value comparing section 426 compares the reception data value received by the signal input/output section 430 to an expected value. The expected value comparing section 426 may receive the expected value from the test signal generating section 423. The test apparatus 410 may judge pass/fail of the device under test 400 based on the comparison result of the expected value comparing section 426.

The signal input/output section 430 is connected to one or more devices under test 400 and exchanges the test signals between the test apparatus 410 and the device under test 400. The signal input/output section 430 may be a performance board mounted on a plurality of devices under test 400. The signal input/output section 430 includes the switching apparatus 100.

The switching apparatus 100 is provided between the testing section 420 and the device under test 400, and provides an electrical connection or disconnection between the testing section 420 and the device under test 400. The test apparatus 410 performs electrical connecting or disconnecting using the switching apparatus 100 according to the present embodiment.

The present embodiment describes an example in which the signal input/output section 430 is connected to one device under test 400, and one switching apparatus 100 is provided to each of the input signal line and the output signal line of the one device under test 400. Instead, the signal input/output section 430 may be connected to a plurality of devices under test 400, and one switching apparatus 100 may be provided to each input signal line and output signal line of each device under test 400. If there is one input/output signal line connecting the signal input/output section 430 to the device under test 400, one switching apparatus 100 may be provided to the one input/output line.

The control section 440 transmits a control signal to the testing section 420 and the signal input/output section 430, to begin execution of the testing by the test apparatus 410. The control section 440 transmits a control signal that causes the testing section 420 to perform a comparison between the test result and the expected value or to generate a test signal, for example, according to a test program. Furthermore, according to the test program, the control section 440 transmits to the signal input/output section 430 instructions for connecting the switching apparatuses 100 provided to signal input/output lines to be connected and instructions for disconnecting the switching apparatuses 100 provided to signal input/output lines to be disconnected.

The test apparatus 410 according to the present embodiment can control switching with low power consumption by controlling the voltage, and can perform testing using the switching apparatus 100 that restricts bowing of the actuator. Furthermore, since the switching apparatus 100 can be used in a wide range of temperature environments, the test apparatus 410 may include a high density of switching apparatuses 100 and can perform testing while reducing the burden on a cooling apparatus, for example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching apparatus comprising:
a contact point section including a first contact point; and
an actuator that moves a second contact point to contact or move away from the first contact point, wherein
the actuator includes a first piezoelectric film that expands and contracts according to a drive voltage to change a bowing amount of the actuator, and a second piezoelectric film that is provided in parallel with the first piezoelectric film and restricts bowing of the actuator caused by stress of the first piezoelectric film in an initial state when the drive voltage is not being supplied to the first piezoelectric film.

2. The switching apparatus according to claim 1, wherein the second piezoelectric film restricts bowing of the actuator caused by expansion and contraction due to temperature change of the first piezoelectric film.

3. The switching apparatus according to claim 1, wherein the first piezoelectric film and the second piezoelectric film are provided on respective sides of a central plane in a thickness direction of the actuator.

4. The switching apparatus according to claim 3, wherein the first piezoelectric film and the second piezoelectric film have substantially the same thickness and are arranged at substantially the same distance from the central plane in the thickness direction of the actuator.

5. The switching apparatus according to claim 4, wherein the actuator includes a plurality of films layered substantially symmetrically with respect to the central plane in the thickness direction.

6. The switching apparatus according to claim 1, wherein the first piezoelectric film and the second piezoelectric film are PZT films.

7. The switching apparatus according to claim 1, wherein the actuator includes a first support layer disposed between the first piezoelectric film and the second piezoelectric film.

8. The switching apparatus according to claim 7, wherein the actuator further includes electrode layers respectively on a top surface and a bottom surface of each of the first piezoelectric film and the second piezoelectric film, the electrode layers applying respective drive voltages.

9. The switching apparatus according to claim 7, wherein the actuator is deposited using a semiconductor process.

10. The switching apparatus according to claim 9, wherein the first support layer is not damaged when heated to a firing temperature of the first piezoelectric film and the second piezoelectric film.

11. The switching apparatus according to claim 10, wherein
the first support layer is an insulating layer.

12. The switching apparatus according to claim 11, wherein
the first support layer includes $SiO_2$ or SiN.

13. The switching apparatus according to claim 11, wherein
the insulating layer has an exposed portion, which is covered by neither the first piezoelectric film nor the second piezoelectric film, at a tip portion of the actuator.

14. The switching apparatus according to claim 13, wherein
the second contact point is provided on the exposed portion.

15. A switching apparatus according comprising:
a contact point section including a first contact point; and
an actuator that moves a second contact point to contact or move away from the first contact point, wherein
the actuator includes:
a first piezoelectric film that expands and contracts according to a drive voltage to change a bowing amount of the actuator;
a second piezoelectric film that is provided in parallel with the first piezoelectric film and restricts bowing of the actuator when the drive voltage is not being supplied to the first piezoelectric film;
a first support layer disposed between the first piezoelectric film and the second piezoelectric film; and
a second support layer and a third support layer that are respectively disposed outward from the first piezoelectric film and the second piezoelectric film with respect to the central plane in the thickness direction of the actuator.

16. The switching apparatus according to claim 15, wherein
the second support layer and the third support layer include $SiO_2$ or SiN.

17. A test apparatus that tests a device under test, comprising:

a testing section that tests the device under test by exchanging electrical signals with the device under test; and the switching apparatus according to claim 1 that is provided between the testing section and the device under test and provides an electrical connection or disconnection between the testing section and the device under test.

18. The switching apparatus according to claim 10, wherein the first support layer is an insulating layer formed using a CVD.

19. The switching apparatus according to claim 1, wherein the second piezoelectric film is formed of substantially the same material as the first piezoelectric film and has substantially the same shape as the first piezoelectric film, and is formed on a surface of the actuator that is opposite to a surface on which the first piezoelectric is formed.

* * * * *